US 8,874,051 B2

(12) United States Patent
Rozenblit et al.

(10) Patent No.: US 8,874,051 B2
(45) Date of Patent: Oct. 28, 2014

(54) SYSTEMS AND METHODS FOR POWER CONTROL IN A MULTIPLE STANDARD MOBILE TRANSMITTER

(75) Inventors: Dmitriy Rozenblit, Irvine, CA (US); Masoud Kahrizi, Irvine, CA (US); Jaleh Komaili, Irvine, CA (US); Rajasekhar Pullela, Irvine, CA (US); Shahrzad Tadjpour, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 140 days.

(21) Appl. No.: 13/310,434

(22) Filed: Dec. 2, 2011

(65) Prior Publication Data

US 2012/0170624 A1    Jul. 5, 2012

Related U.S. Application Data

(60) Provisional application No. 61/419,549, filed on Dec. 3, 2010.

(51) Int. Cl.
*H04B 1/04* (2006.01)
*H03G 3/30* (2006.01)

(52) U.S. Cl.
CPC .................. *H03G 3/3042* (2013.01)
USPC ...................... 455/127.1; 455/126

(58) Field of Classification Search
USPC .............. 455/115.1, 118, 126, 127.1, 127.2, 455/127.3
See application file for complete search history.

(56) References Cited

U.S. PATENT DOCUMENTS

| 7,260,367 | B2 * | 8/2007 | McMorrow et al. .......... 455/108 |
| 7,277,678 | B2 | 10/2007 | Rozenblit et al. |
| 7,353,006 | B2 | 4/2008 | Gels et al. |
| 7,805,115 | B1 * | 9/2010 | McMorrow et al. .......... 455/108 |
| 8,238,853 | B2 * | 8/2012 | Drogi et al. ................. 455/127.2 |
| 2009/0156143 | A1 | 6/2009 | Shute |
| 2009/0298448 | A1 | 12/2009 | Mayer et al. |

FOREIGN PATENT DOCUMENTS

WO    WO 2012/075436    6/2012

OTHER PUBLICATIONS

Search Report and Written Opinion of Jul. 27, 2012 for International Application No. PCT/US2011/063143. 11 pages.

* cited by examiner

*Primary Examiner* — Blane J Jackson
(74) *Attorney, Agent, or Firm* — Knobbe, Martens, Olson & Bear, LLP

(57) ABSTRACT

A transmitter adjusts a transmitted power level by modifying a control input of a variable gain amplifier. A power amplifier control system includes an envelope extractor, an error extractor, and a feed-forward multiplier. The envelope extractor receives data signal inputs and computes the envelope of the combined signal. The error extractor generates an error signal as a function of the combined signal and the output power generated by the power amplifier. The feed-forward multiplier generates a modified error signal that is responsive to a function of the gain in a feedback path. A corresponding method for controlling a power level is also disclosed. In some embodiments, a transmit chain with a power control loop is used to adjust the transmit signal power applied at an input of a variable gain amplifier. A corresponding method for adjusting the transmit signal power level is also included.

50 Claims, 6 Drawing Sheets

SYSTEMS AND METHODS FOR POWER CONTROL IN A MULTIPLE STANDARD MOBILE TRANSMITTER

RELATED APPLICATIONS

This application claims the benefit of priority under 35 U.S.C. §119(e) of U.S. Provisional Patent Application No. 61/419,549, filed on Dec. 3, 2010, and entitled "SYSTEMS AND METHODS FOR POWER CONTROL IN A MULTIPLE STANDARD MOBILE TRANSMITTER," the disclosure of which is hereby incorporated by reference in its entirety.

BACKGROUND

1. Field

The present disclosure generally relates to the field of radio-frequency communication device, and more particularly, to systems and methods for controlling power in a multiple standard mobile transmitter.

2. Description of the Related Art

As the designs of portable radio-frequency (RF) communication devices, such as cellular telephones, personal digital assistants (PDAs), WiFi transceivers, and other mobile communication devices evolve, it is desirable to have such devices be capable of adjusting transmitted power accurately over a relatively wide dynamic range. For example, in the emerging markets of 3G/3.9G, linear systems such as those that communicate in accordance with standards such as WCDMA, WiMAX, EUTRAN-LTE, and other non-constant envelope modulation methodologies, the requirements for those standards for accurate transmitted power control continue to present challenges.

In mobile communication systems, power control can be mandated to ensure that the respective power levels of communication signals arriving at a base station from various mobile devices are relatively the same. To accomplish this goal, the base station can continuously monitor the received signal power from each mobile device communicating with the base station. The base station can then direct each mobile device to adjust the transmit power level depending upon one or more factors, such as its distance, data rate change, and/or channel condition.

The presence of time-varying signal information (e.g., modulation) on the envelope of the transmitted signal can create a conflict in design requirements for setting the transmitted signal power and accurately controlling the same during a signal transmission or burst in WCDMA and LTE communication systems. The first conflict can arise from a requirement to maintain average power step accuracy (in some cases the power step accuracy must be maintained to within as little as ⅛ dB). To meet this requirement, the control loop should be relatively fast to not adversely affect the average output power level. However, if the control loop is too fast, the control loop can strip information from the signal envelope, introducing an error in the transmitted signal. To minimize the impact of such errors, especially for high peak-to-average ratio modulation formats, the bandwidth of the control loop can be kept low. It is possible to apply or switch between a control loop having a bandwidth that enables a fast response and a bandwidth that permits a relatively slower response, but it takes time to ensure that the average achieved target power when operating in the fast response mode is accurate so that a switch to the slow response mode would not occur when the instantaneous error in the transmit power is substantial. Such a switch can result in a significant error in the transmitted power for an undesirable time period.

Still another problem can arise when the modulation format or data pattern changes. While the average signal power over an entire transmission or burst may not change, the average power during some part of the transmission could be off by more than the required power setting tolerance. If such a condition occurs when the control loop is operating in a fast response mode (e.g., with a wide bandwidth), the control loop could set the output power to an incorrect target value.

Conventional transmitter architectures generally apply analog power control schemes by adjusting and combining elements in a transmitter chain in an effort to generate a continuous and controllable transmitted output power. Such transmitter chains, to be successful, use several continuously variable gain elements. The performance of the elements as well as the accuracy of the transition between them can be established by design, calibration information, compensation elements, and information regarding the supply voltage, temperature, etc. Such a design can be extremely challenging and can require significant calibration effort to adjust for production tolerances and temperature variation over a relatively wide range of operational temperatures for each of the independent and overlapping gain/attenuation stages.

SUMMARY

Embodiments of power control systems and methods for accurately controlling transmitted power in a multiple standard mobile transmitter cancel a transmit signal modulation envelope within a transmit signal power control loop. Accordingly, the mobile transmitter controls transmitted power independent of the data pattern and absent degradation of the error vector magnitude without affecting the accuracy of the desired transmit power.

In a number of implementations, the present disclosure relates to a mobile transmitter having a transmit signal power control system that includes an envelope extractor, an error extractor, and a feedforward multiplier. The envelope extractor is configured to receive in-phase and quadrature-phase digital signal inputs and calculate an instantaneous value of the envelope of a combined data signal (including the in-phase and quadrature-phase digital signal inputs), which is applied at an envelope extractor output. The error extractor is coupled to the envelope extractor output and to a digital representation of the output power generated by a power amplifier as modified by a feedback multiplier. The error extractor is configured to generate an error signal at an extractor output. The feed-forward multiplier is coupled to the extractor output. The feed-forward multiplier configured to generate a modified error signal at a feed-forward multiplier output. In some embodiments, the modified error signal can be applied at the control input of a variable gain amplifier in the mobile transmitter to controllably adjust the power of a transmit signal. In some embodiments, the modified error signal can be used to generate coarse and fine digital control words that are coupled to a multiple stage transmit chain of analog components to controllably adjust the power of a transmit signal.

In embodiments that use a linear power detector (e.g., transmitters communicating using WCDMA/LTE communication protocols) a power or unit converter can be introduced in a control signal generator, which can be located in a feed-forward path of the control loop. In alternative embodiments that use a log power detector (e.g., transmitters communicating using EDGE/GMSK communication protocols) the power or unit converter can be introduced in the reference path of the control loop.

In some embodiments, additional transmit signal power control can be provided by a transmit chain having a first stage, a second stage, and a third stage. The transmit chain can be configured to receive a baseband in-phase data signal and a baseband quadrature-phase data signal and generate a transmit signal that is coupled to a signal input of a variable gain amplifier. A transmit chain controller, coupled to the transmit chain, can controllably adjust the gain within one or more of the first stage, the second stage and the third stage of the transmit chain.

In accordance with a number of implementations, the present disclosure relates to a method for accurately controlling an adjustable power level in a transmitter that is transmitting a data signal with a time-varying signal envelope. The method includes determining, in an envelope extractor, an instantaneous representation of the data signal envelope. The method further includes generating a scaled representation of the power at an output of a power amplifier. The method further includes generating an error signal as a function of both an instantaneous representation of the data signal envelope and the scaled representation of the power at the output of the power amplifier. The method further includes modifying the error signal as a function of the gain in a feedback path to generate a modified error signal.

In embodiments that use a log power detector to monitor the output power of the power amplifier (e.g., transmitters communicating using EDGE/GMSK communication protocols), the method can further include a step of applying a linear to logarithmic converter to generate a scaled version of the reference signal. In embodiments that use a linear power detector to monitor the output power of the power amplifier (e.g., transmitters communicating using WCDMA/LTE communication protocols), the method can further include a step of applying a linear to logarithmic converter to the modified error signal to generate a power control signal suitable for controlling a variable gain amplifier in a transmitter.

According to some implementations, the present disclosure relates to a method for accurately controlling an adjustable power level of a data signal in an analog transmit chain of a transmitter. The method includes adjusting a controllable gain level of a digital-to-analog converter based on a desired peak-to-average ratio of the transmit signal envelope. The method further includes adjusting a digitally controlled discrete gain-step amplifier. The amount of gain per step is responsive to an initial estimate of the transmitter gain and a target power at the output of the variable gain amplifier. The method further includes applying a factor to a gain adjuster responsive to the gain step change in the analog transmit chain.

In some implementations, the present disclosure relates to a signal power control system that includes a reference generator implemented to receive and combine an in-phase digital signal and a quadrature-phase digital signal so as to yield a combined signal. The reference generator is further implemented to generate an output signal representative of an instantaneous value of an envelope of the combined signal. The system further includes an error extractor implemented to receive a first input signal including the output signal of the envelope extractor and a second input signal including a digital representation of an output of a power amplifier. The error extractor is further implemented to generate an error signal based on the first and second input signals. The system further includes a control signal generator implemented to receive the error signal and generate one or more control signals for controlling a gain of an analog section of a transmit chain that provides a modulated analog signal to the power amplifier so as to substantially cancel a modulation envelope associated with the modulated analog signal.

In some embodiments, the power control system can include a transmit signal power control system. In some embodiments, the reference generator can include an envelope extractor configured to receive and combine the in-phase and quadrature-phase digital signals and generate the instantaneous value of the envelope of the combined signal.

In some embodiments, the control signal generator can include an error estimator and a logic element configured to quantify the magnitude of the error signal and generate a coarse power control signal and an adjustment signal. The control signal generator can further include a multiplier configured to receive as inputs the error signal and a sum of the adjustment signal from the logic element and an inverse of a feedback-path gain factor, the control signal generator further configured to generate a fine power control signal that reduces undesired changes in loop gain of a power control loop. The fine power control signal can include a product of the inputs.

In some embodiments, the control signal generator can further include a digital adder configured to receive and add the adjustment signal from the logic element and the inverse of a feedback-path gain factor, the digital adder further configured to provide the sum to the multiplier. In some embodiments, the control signal generator can further include a low-pass filter configured to remove or filter the fine power control signal.

In some embodiments, the transmit signal power control system can be configured to operate under a plurality of communication modes, such as but not limited to WCDMA/LTE communication modes and EDGE/GMSK communication modes. For the EDGE/GMSK example, the reference generator can include a unit converter configured to receive the instantaneous value of the envelope and generate a converted value representative of the instantaneous value. The unit converter can be further configured to forward to the converted value to the error extractor. The unit converter can include, for example, a log converter configured to perform a linear-to-logarithmic conversion.

In some embodiments, the control signal generator can include a unit converter configured to receive at least one of the one or more control signals and generate a converted value. The at least one control signal can include a fine power control signal. Such a unit converter can include a log converter configured to perform a linear-to-logarithmic conversion.

In accordance with a number of implementations, the present disclosure relates to a transmitter module for a wireless device. The module includes a packaging substrate. The module further includes a semiconductor die mounted on the packaging substrate. The semiconductor die includes an integrated circuit configured to provide power control for transmitted signal. The integrated circuit includes a reference generator implemented to receive and combine an in-phase digital signal and a quadrature-phase digital signal so as to yield a combined signal. The reference generator is further implemented to generate an output signal representative of an instantaneous value of an envelope of the combined signal. The integrated circuit further includes an error extractor implemented to receive a first input signal including the output signal of the envelope extractor and a second input signal including a digital representation of an output of a power amplifier. The error extractor is further implemented to generate an error signal based on the first and second input signals. The integrated circuit further includes a control signal generator implemented to receive the error signal and generate one or more control signals for controlling a gain of an analog section of a transmit chain that provides a modulated analog signal to the power amplifier so as to substantially cancel a modulation envelope associated with the modulated analog signal. In some embodiments, the transmitter module can be a part of a transceiver module.

In some implementations, the present disclosure relates to a wireless device having an antenna configured to facilitate receiving and sending of radio-frequency (RF) signals. The wireless device further includes a receiver circuit configured to process an RF signal received from the antenna. The wireless device further includes a transmitter circuit configured to process an RF signal to be provided to the antenna. The transmitter circuit includes an integrated circuit configured to provide power control for transmitted signal. The integrated circuit includes a reference generator implemented to receive and combine an in-phase digital signal and a quadrature-phase digital signal so as to yield a combined signal. The reference generator is further implemented to generate an output signal representative of an instantaneous value of an envelope of the combined signal. The integrated circuit further includes an error extractor implemented to receive a first input signal including the output signal of the envelope extractor and a second input signal including a digital representation of an output of a power amplifier. The error extractor is further implemented to generate an error signal based on the first and second input signals. The integrated circuit further includes a control signal generator implemented to receive the error signal and generate one or more control signals for controlling a gain of an analog section of a transmit chain that provides a modulated analog signal to the power amplifier so as to substantially cancel a modulation envelope associated with the modulated analog signal. The wireless device further includes a baseband subsystem configured to provide control signals for operation of the receiver and transmitter circuits.

In some embodiments, wireless device can be configured to operate under a plurality of communication modes. Such communication modes can include, but are not limited to, WCDMA/LTE communication modes and EDGE/GMSK communication modes.

According to some implementations, the present disclosure relates to a transmit signal power control system for a wireless device. The system includes a transmit signal path having a transmit chain and one or more power amplifiers. The transmit chain is configured to receive a digital input signal and generate a modulated analog signal as an input for the one or more power amplifiers. The transmit chain includes an analog section configured to provide variable gain for the modulated analog signal. The system further includes a control loop configured to generate one or more control signals for adjusting the variable gain of the analog section of the transmit chain based on a digital representation of an output of the one or more power amplifiers and the digital input signal, such that the transmit power control system is responsive to a gain change but substantially non-responsive to a modulation change.

In some embodiments, the control loop can be configured so as to substantially cancel a modulation envelope associated with the modulated analog signal. In some embodiments, the substantially non-responsiveness to the modulation change can allow the transmit signal power control system to operate under different communication protocols substantially independent of the modulation envelope.

In a number of implementations, the present disclosure relates to a method for controlling power of a radio-frequency (RF) signal in a wireless device. The method includes generating a modulated analog signal based on a digital input signal. The method further includes amplifying the modulated analog signal so as to yield an output signal. The method further includes generating, by a control loop, a control signal for adjusting a gain associated with the modulated analog signal based on a digital representation of the output signal and the digital input signal. The method further includes adjusting the gain associated with the modulated analog signal, such that the adjusted modulated analog signal is substantially non-responsive to a modulation change.

In some embodiments, the adjusted modulated analog signal can be responsive to a gain change. In some embodiments, the generating of the control signal can be performed so as to substantially cancel a modulation envelope associated with the modulated analog signal. In some embodiments, the substantially non-responsiveness to the modulation change can allow the controlling of power to be performed under different communication protocols substantially independent of the modulation envelope.

Other systems, devices, circuits, methods, features, and advantages will be or will become apparent to one with skill in the art upon examination of the following figures and detailed description. It is intended that all such additional systems, methods, features, and advantages be included within this description, be within the scope of and protected by the accompanying claims.

BRIEF DESCRIPTION OF THE DRAWINGS

The transmitters and methods for controlling an adjustable transmit signal power level can be better understood with reference to the following figures. The components within the figures are not necessarily to scale, emphasis instead being placed upon clearly illustrating the principles of how to cancel or substantially reduce the effects of signal modulation in a transmit signal power control loop. Moreover, in the figures, like reference numerals designate corresponding parts throughout the different views.

DETAILED DESCRIPTION

Figure 1:
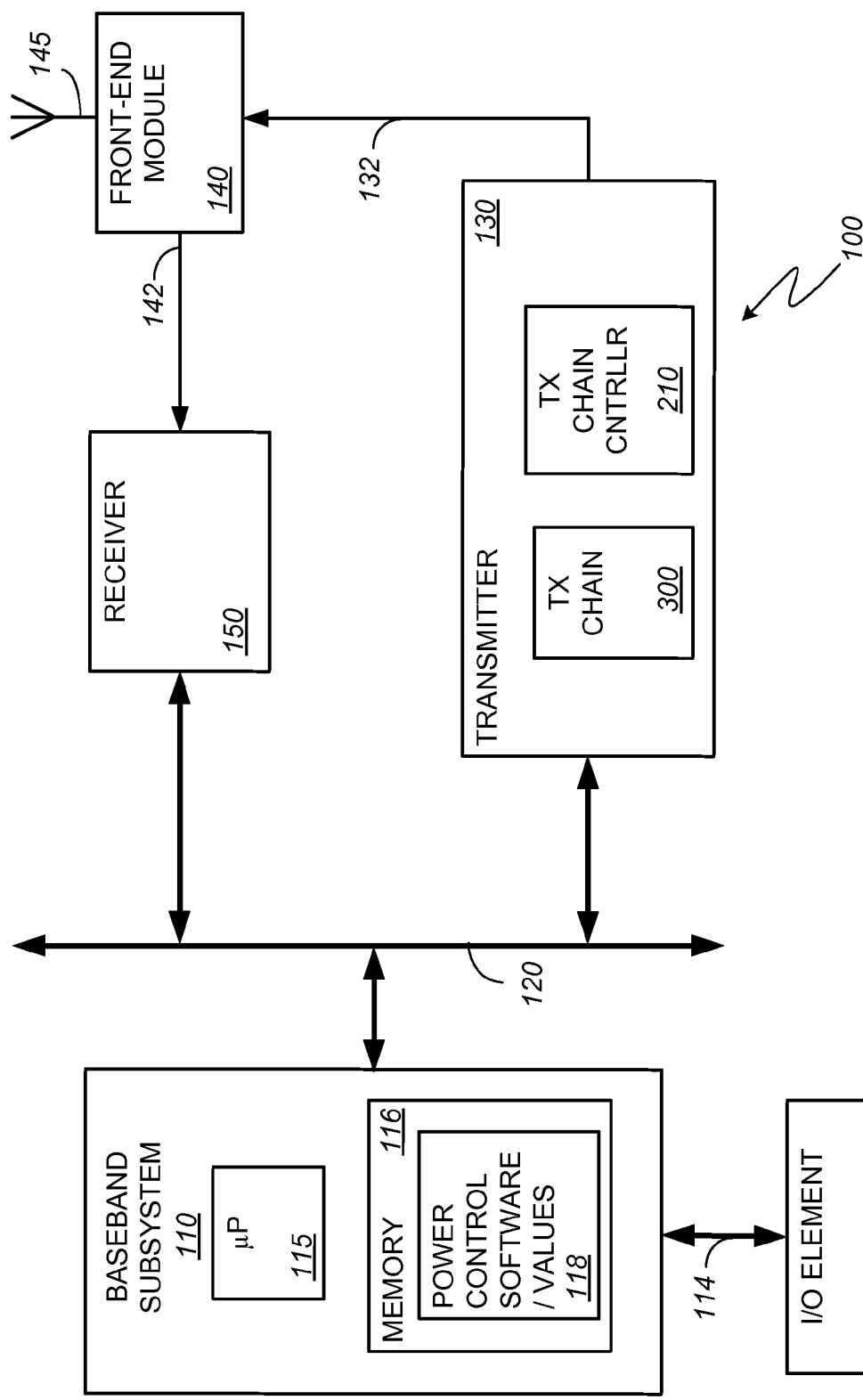
FIG. 1 is a block diagram of an embodiment of a simplified portable transceiver including a multiple-mode transmitter.

Although example embodiments are described in relation to a portable radio-frequency (RF) transceiver, and more specifically a transmitter in a portable RF transceiver, embodiments of the present transmit signal power control systems and methods for controlling an adjustable power level of a transmit signal can be applied in any application where a continuous and adjustable signal power is desired.

In some implementations, power control systems and methods for accurately controlling transmitted power in a multiple standard mobile transmitter can include performing power control via controlled steps. Thereafter, a final target power can be achieved using a relatively narrow range analog control loop. The analog control loop can be configured to cancel a transmit signal modulation envelope within the control loop. Accordingly, the mobile transmitter can control transmitted power independent of the data pattern and with absent or reduced degradation of the error vector magnitude and without affecting the accuracy of the desired transmit power. Setting of the required RF analog gain can be achieved via a reconfigurable local power/gain control loop, which can be configured to use elements of the automated transmit signal power control system when the transmit power is controlled in an open loop mode.

The transmitters and methods for controlling an adjustable transmit signal power level can be implemented in hardware, software, or a combination of hardware and software. When implemented in hardware, the transmitters and methods can be implemented using specialized hardware elements and logic. When the transmitters and methods are implemented partially in software, the software portion can be used to control components in a transmitter or a variable gain amplifier so that various operating aspects can be software-controlled. The software can be stored in a non-transitory state in a memory element or elements and executed by a suitable instruction execution system (e.g., a microprocessor) coupled to the memory. The hardware implementation of the gain control systems and methods for controlling an adjustable transmit signal power level can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the transmitters and methods for controlling an adjustable transmit signal power level comprises an ordered listing of executable instructions for implementing logical functions, and can be embodied in any computer-readable medium for use by or in connection with an instruction execution system, apparatus, or device, such as a computer-based system, processor-containing system, or other system that can retrieve the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In some implementations, a transmit signal path can include a number of series connected devices arranged in a transmit chain and one or more variable gain power amplifiers. The transmit signal power can be adjusted by controlling signal power with the devices in the transmit chain and the one or more variable gain power amplifiers. The transmit chain can be configured to receive a digital input signal from a baseband subsystem and convert the same to a modulated analog signal, which can be applied at the input of the one or more variable gain power amplifiers. The power at the output of the one or more variable gain power amplifiers can be a scaled version of the power present in the input data signal. To maintain the required averaged power step accuracy in a WCDMA/LTE transmitter, the transmitter can include a transmit chain controller that is configured to generate a gain control signal or signals by comparing the power at the output of a power amplifier in the transmit signal path with the power in the input data signal to thereby generate or facilitate generation of an error signal. The implementation can include a cancellation of the modulation envelope within the power control loop implemented by the transmit chain controller. Accordingly, the transmitter can react to a gain change rather than the combination of a gain change and modulation change. The error signal can be adjusted to maintain the desired gain between the input signal power and the output signal power of the transmit chain. Because the average amplitude of the digital reference signal is fairly constant, the transmit signal power at the output of the power amplifier can be well controlled.

In some implementations, a transmit chain, operating under the control of a transmit chain controller, can be used to adjust the transmit signal power that is applied at an input of the power amplifier. The transmit chain can include multiple stages of gain controllable elements coupled in series. A first stage can include a low-power path and a high-power path. Each of the respective paths can include a series combination of an analog-to-digital converter, a low-pass filter, and a modulator. A second stage can include a step attenuator with a low-power element or circuit coupled to the low-power path of the first stage and a high-power element or circuit coupled to the high-power path of the first stage. A third stage can include a gain-step amplifier with scaling circuits coupled to the low-power element and the high-power element of the second stage. The output of the third stage can be coupled to the signal input of the power amplifier.

The transmit chain controller can be arranged in a closed control loop with the transmit chain. The transmit chain controller can be configured to receive an indication of the transmit signal power from a power detector, which can be coupled to one or more locations in the transmit chain. The transmit chain controller can further be configured to cancel the modulation envelope from the transmit signal and generate coarse and fine control signals for adjusting respective elements in the transmit chain to modify the transmit signal power applied at an input to the power amplifier.

In accordance with an illustrative or example embodiment of the transmitters and methods for controlling an adjustable transmit signal power level, FIG. 1 includes a block diagram illustrating a simplified wireless communication system 100 including a transmitter 130 with a transmit chain controller 210 and a transmit chain 300. The wireless communication system 100 can include a baseband subsystem 110, an input/output (I/O) element 112, the transmitter 130, a front-end module 140, an antenna 145, and a receiver 150. The baseband subsystem 110 can be configured to communicate with the transmitter 130 and the receiver 150 via communication bus 120. The I/O element 112 can be coupled to the baseband subsystem 110 via connection 114. The I/O element 112 can represent any interface with which a user may interact with the wireless communication system 100. For example, the I/O element 112 may include a speaker, a display, a keyboard, a microphone, a trackball, a thumbwheel, or any other user-interface element. A power source (not shown), which may be a direct-current (DC) battery or other power source, can also be connected to the baseband subsystem 110 to provide power to the wireless communication system 100. In some embodiments, the wireless communication system 100 can include, for example but not limited to, a portable-telecommunication device such as a mobile cellular-type telephone.

The baseband subsystem 110 can include microprocessor (μP) 115 and memory 116. The microprocessor 115 and the memory 116 can be in communication with each other. Depending on the manner in which the transmit chain 300 and transmit chain controller 210 and methods for controlling an adjustable transmit signal power level are implemented, the baseband subsystem 110 may also include one or more of an application-specific integrated circuit (ASIC), a field programmable gate array (FPGA), or any other implementation-specific or general processor, among other devices.

The baseband subsystem 110, via microprocessor 115 and the memory 116, can be configured to provide the signal timing, processing, input, output, and/or storage functions for the wireless communication system 100. In addition, the baseband subsystem 110 can be configured to generate various control signals, such as power control signals, filter control signals, and modulator control signals that are used to direct various functions within the transmitter 130, the front-end module 140, and the receiver 150 as known to those skilled in the art. The various control signals may originate from the microprocessor 115 or from any other processor within the baseband subsystem 110, and can be supplied to a variety of connections within the transmitter 130, the front-end module 140, and the receiver 150. It should be noted that, for simplicity, only the basic components of the wireless communication system 100 are illustrated herein. It should be further noted that the transmit chain 300 and the transmit chain controller 210 can include digital circuits that may include additional volatile and/or non-volatile storage elements for storing detected power levels and other parameters.

If some or all of the transmit chain 300, the transmit chain controller 210 and the methods for controlling an adjustable transmit signal power level are implemented in software that is executed by the microprocessor 115, the memory 116 can also include power control software 118. The power control software 118 can include one or more executable code segments and/or data values that can be stored in the memory 116 and executed in the microprocessor 115. Alternatively, the functionality of the power control software 118 can be coded into an ASIC (not shown) or can be executed by an FPGA (not shown), or another device. The functionality of the power control software 118 can also be provided by a suitably configured controller or processor in the transmitter 130. Because the memory 116 can be rewritable and because a FPGA is reprogrammable, updates to the power control software 118 including gain stages or ranges, calibration data, etc. can be remotely sent to and saved in the wireless communication system 100 when implemented using either of these methodologies.

In one embodiment, the power control software 118 can include one or more executable code segments for configuring the transmit chain 300 and the transmit chain controller 210 to operate in conjunction with other transmitter elements and the baseband subsystem 110. Once configured and/or initialized, transmit signal power can be controlled by the controllable elements in the transmit chain 300. Example controllable elements can include one or more RF power amplifiers, digital multipliers, low-pass filters, analog-to-digital digital converters, modulators, step-attenuators, gain-step amplifiers, and a logic element, among other elements that can affect the power of a RF signal. The arrangement and operation of the transmitter elements will be explained in association with the functional block diagrams of FIGS. 2-6.

The transmitter 130 can include a modulator (not shown) configured to modulate the analog signals and provide a modulated signal to an upconverter (not shown). The upconverter can be configured to transform the modulated signal on to an appropriate transmit frequency and provide the upconverted signal to a power amplifier (not shown). The power amplifier can be configured to amplify the upconverted signal to an appropriate power level for the communication protocol or standard in which the wireless communication system 100 is designed to operate. The transmit chain 300 and the transmit chain controller 210 can be configured to dynamically and selectively manage the transmitted signal power from the wireless communication system 100 in conjunction with one or more variable gain amplifiers.

The modulated, upconverted, amplified and power controlled transmit signal can be forwarded to the front-end module 140 via connection 132. Details of the transmitter 130 have been omitted, as they will be understood by those skilled in the art. The front-end module 140 can include an antenna system interface that may include, for example, a diplexer having a filter pair that allows simultaneous passage of both transmit signals and receive signals in respective frequency ranges, as known to those skilled in the art. The transmit signal can be supplied from the front-end module 140 to the antenna 145 for signal transmission to suitably configured communication devices, such as a base station, remote from wireless communication system 100.

In some implementations, a signal received by an antenna 145, from the base station or other emitter, can be directed from the front-end module 140 to the receiver 150 via connection 142. The receiver 150 can include various components to downconvert (e.g., translate in frequency), digitize, and filter a recovered data signal from a receive signal, as known to those skilled in the art. A mixing stage can be configured to downconvert and separate the received RF signal into in-phase (I) and quadrature-phase (Q) receive signals. The I and Q receive signals can be sampled and transformed into digital signals by one or more analog-to-digital converters (ADCs). One or more specialized digital filters can be introduced to further process the I and Q receive signals.

In some embodiments, the transmitter 130 and the receiver 150 may be collocated in an integrated transceiver, such as when the transmitter 130 and the receiver 150 are implemented on a radio-frequency (RF) integrated circuit (IC). In alternative embodiments, the receiver 150 and the transmitter 130 can be implemented on separate ICs. Under both architectures, the transmit chain 300 and the transmit chain controller 210 can preferably be implemented in hardware on an integrated circuit in the transmitter 130.

In some embodiments, one or more integrated circuits associated with the transmitter 130, receiver 150, and/or transceiver can be implemented in one or more semiconductor dies. In some embodiments, one or more of such semiconductor dies can be implemented as a packaged module. In some embodiments, such a packaged module can include a packaging substrate such as a laminate substrate configured to receive and connect to a die by wirebond or flip-chip connections. The packaged module can further include packaging structures that provide functionalities such as protection of the die and easier handling.

Figure 2:
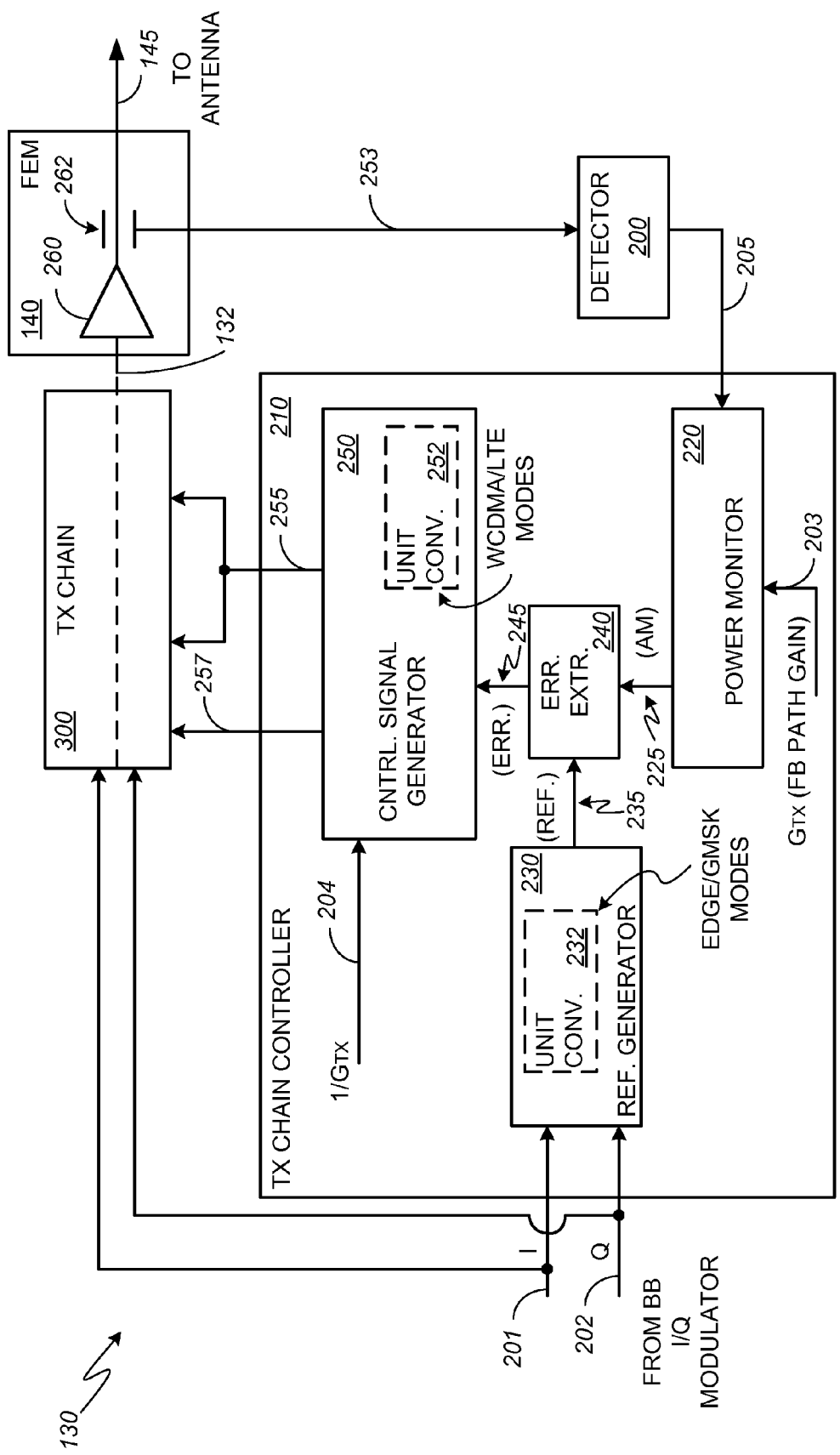
FIG. 2 is a schematic diagram of an embodiment of the multiple-mode transmitter of FIG. 1.

FIG. 2 is a schematic diagram of an embodiment of the transmitter 130 of FIG. 1 that can support alternative wireless communication modes. The transmitter 130 can support both examples of WCDMA/LTE and EDGE/GMSK communication modes. The transmitter 130 can include a power detector 200, a transmit chain controller 210 and the transmit chain 300. In some implementations, a signal coupler 262 can provide a signal that is a function of the signal power at the output of a power amplifier 260 to the detector 200 on connection 253. The detector 200, which may be, for example, a linear RF voltage detector or a RF envelope detector, can be configured to provide a signal on connection 205 that is a function of the signal on connection 253.

In some implementations, the transmit chain controller 210 can include a power monitor 220, a reference generator 230, an error extractor 240 and a control signal generator 250. The power monitor 220 can be configured to receive the signal on connection 205 and an input on connection 203 and generate a gain adjusted representation of the signal power on connection 225. The input on connection 203 can include a factor or variable indicative of the gain (or loss) in the feedback path. The feedback path can include the signal coupler 262, the detector 200, and the power monitor 220. The power monitor 220 can be configured to convert the received signal into a digital signal before filtering and applying the factor to the filtered signal to adjust for signal power gain or loss in the feedback path. The gain adjusted representation of the signal power on connection 225 can be forwarded to the error extractor 240.

The reference generator 230 can be configured to receive in-phase and quadrature-phase digital input signals from the baseband subsystem 110. The in-phase digital signal input can be received on connection 201. The quadrature-phase digital input signal can be received on connection 202. The in-phase and quadrature-phase digital signal inputs can be the component parts of the transmit signal, which is applied to the transmit chain 300 where it can be combined, converted, modulated and amplified before being forwarded on connection 132 to the front-end module 140 (FIG. 1). The reference generator 230 can be further configured to combine the in-phase and quadrature-phase signals and computes the instantaneous value of the envelope of the combined signal (indicated as a reference signal), which is forwarded on connection 235 to the error extractor 240.

The error extractor 240 can be configured to compare the gain adjusted representation of the signal power that was received from the power monitor 220 with the reference signal on connection 235 to generate an error signal. The error signal can be forwarded on connection 245 to the control signal generator 250.

The control signal generator 250 can be configured to receive the error signal on connection 245 and an input on connection 204 and generate one or more control signals, which can be forwarded on connection 255 and connection 257 to various adjustable elements in the transmit chain 300 to modify the transmit signal power applied to the power amplifier 260. The input on connection 204 can include a factor or variable indicative of the inverse of the gain (or loss) in the feedback path.

In addition to applying the inverse of the gain in the feedback path to compensate the control loop, the control signal generator 250 can be further configured to perform a unit conversion to compensate for the power gains introduced in the transmit chain 300. When the transmitter 130 is operating in WCDMA/LTE communication modes, the control signal generator 250 can apply a unit converter 252 to the generated control signals. The unit converter 252 can be a linear-to-logarithmic converter configured to compensate or adjust the one or more control signals on connection 255 for the logarithmic gain provided in the transmit chain 300 of the transmitter 130.

In some implementations, the transmit chain controller 210 can also be configured to support EDGE/GMSK communication modes. It can be important to maintain closed loop control of the output power in EDGE/GMSK communication modes during burst transmissions because changes in power amplifier temperature during the burst transmissions can result in undesired output power changes during the course of the burst. The detector 200 used to detect signal power when communicating in WCDMA/LTE modes (e.g., a linear detector) can be replaced by a log detector. The output of the log detector can be applied to the power monitor 220. The internal arrangement of the power monitor 220 need not change. However, as illustrated in FIG. 2, the unit converter 252 can be removed from the control signal generator 250 and be inserted in the reference generator 230 as a unit converter 232. In this way, the amplitude modulated signal on connection 225 from the power monitor 220 and an amplitude modulated signal within the reference generator 230 can both be log converted signals. Consequently, the error extractor 240 can be presented with similarly scaled input signals.

As illustrated and described, operation of the transmit chain controller 210 can result in a control loop absent analysis of the data pattern, delays or inaccuracies caused by limited time averaging as would otherwise be applied or present in a control system that did not cancel the data modulation. Thus, the transmit chain controller 210 can be applied and can greatly simplify and improve transmit power control performance during a modulation format switch. The transmit chain controller 210 can further benefit an implementation of the transmit chain 300 as a combination of continuously variable and switched gain devices.

Even though the corner frequencies of optional low-pass filters in the transmit chain controller 210 (not shown) can be arranged to accommodate the baseband transmit signal sampling rate and any time delay in the transmit chain 300 (i.e., the transmit signal path) is expected to be relatively short in time, a one-time alignment of the reference path delay could be required to ensure that the instantaneous value of the envelope is aligned with the transmit signal at the power amplifier 260. The one-time alignment could be implemented via delay lines or other mechanisms applied to the in-phase and quadrature-phase data inputs before entry into the transmit chain 300. The alignment delay could be determined from simulated data or in accordance with actual results during a calibration of the transmitter 130.

Figure 3:
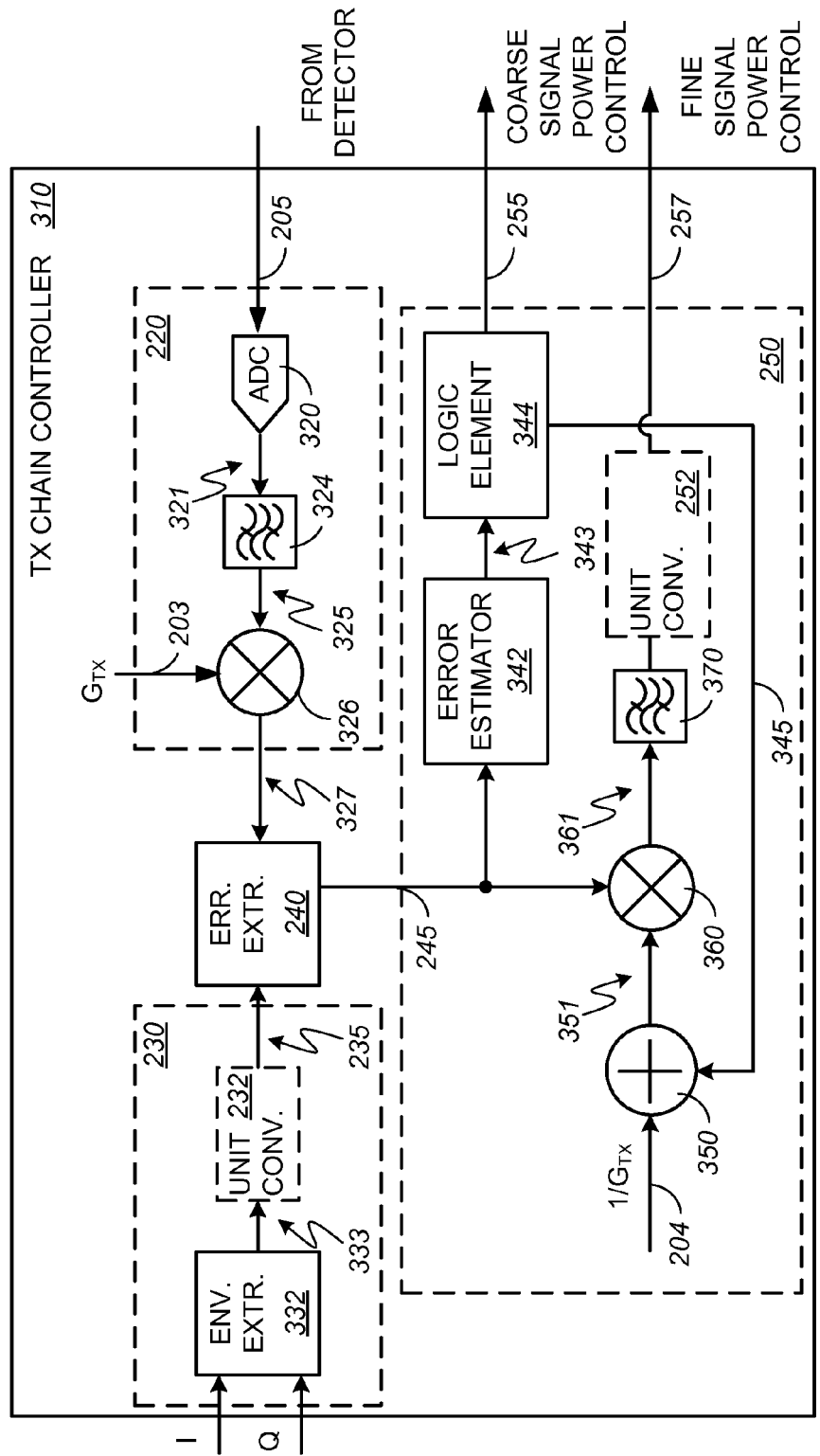
FIG. 3 is a schematic diagram of an embodiment of the transmit chain controller of FIG. 2.

FIG. 3 includes an example embodiment of a transmit chain controller 310. The transmit chain controller 310 can be configured to receive an analog signal from the detector 200 on connection 205 and convert the same to a digital signal in the analog-to-digital converter 320. The output of the analog-to-digital converter 320 can be coupled to a lowpass filter 324 by connection 321. The low-pass filter 324 can remove or reduce signal components in the digitized representation of the signal power above a corner frequency of the low-pass filter 324. The low-pass filtered signal can be forwarded on connection 325 to a digital multiplier 326. The digital multiplier 326 can adjust the magnitude of the digital representation of the signal power by a feedback-path gain control factor, $G_{TX}$, provided on connection 203, and provide a scaled version of the signal power on connection 327 to the error extractor 240.

The transmit chain controller 310 can also receive the in-phase input signal and the quadrature-phase input signal at the input of the envelope extractor 332. The envelope extractor 332 can compute an instantaneous value of the signal envelope by computing the square root of the sum of the squares of the in-phase input signal and the quadrature-phase input signal. When the transmit chain controller 310 is operating in WCDMA/LTE communication modes, the computed envelope value can be forwarded to the error extractor 240 on connection 235. Otherwise, when the transmit chain controller 310 is operating in EDGE/GMSK communication modes, the computed envelope value can be forwarded to the unit converter 232 on connection 333. The output of the unit converter 232 (e.g., a log converter) can be forwarded to the error extractor 240 on connection 235. The error extractor 240 can calculate the difference of the envelope at its data signal input (e.g., connection 235 or connection 333) and the scaled version of the signal power on connection 327 and forward the result (e.g., an error signal) to the error estimator 342 and the multiplier 360 on connection 245. The error estimator 342 can quantify the magnitude of the error signal on connection 245 and forward the same on connection 343 to the logic element 344. The logic element 344 can generate a coarse transmit power control signal on connection 255 and an adjustment signal on connection 345. A digital adder 350 can receive the inverse of the feedback-path gain control factor (i.e., $1/G_{TX}$) on connection 204 and the adjustment signal on connection 345 and forward the sum of the adjustment signal and the inverse of the feedback-path gain control factor on connection 351 to the multiplier 360. The multiplier 360 can forward the product of the error signal on connection 245 and the sum of the adjustment signal and the inverse of the feedback-path gain control factor on connection 351 to the low-pass filter 370. The multiplication of the error signal on connection 245 with the inverse of the feedback-path gain control factor ($1/G_{TX}$) can keep the loop gain substantially constant. The adjustment signal on connection 345 can provide a small additive offset, which may be positive, zero, or negative, to the inverse of the feedback-path gain control factor ($1/G_{TX}$), thereby providing a way to adjust the loop bandwidth, based on the state of logic element 344. The low-pass filter 370 can remove or reduce signal components in the signal on connection 361 above a corner frequency of the low-pass filter 370. When the transmitter 130 is operating in an EDGE/GMSK communication mode, a fine power control signal can be forwarded on connection 257 from the low-pass filter 370. Otherwise, when the transmitter 130 is operating in a WCDMA/LTE communication mode, the output of the low-pass filter 370 can be forwarded to unit converter 252, which can provide a linear to log conversion on the signal from the low-pass filter 370 before forwarding the converted fine power control signal on connection 257.

Figure 4:
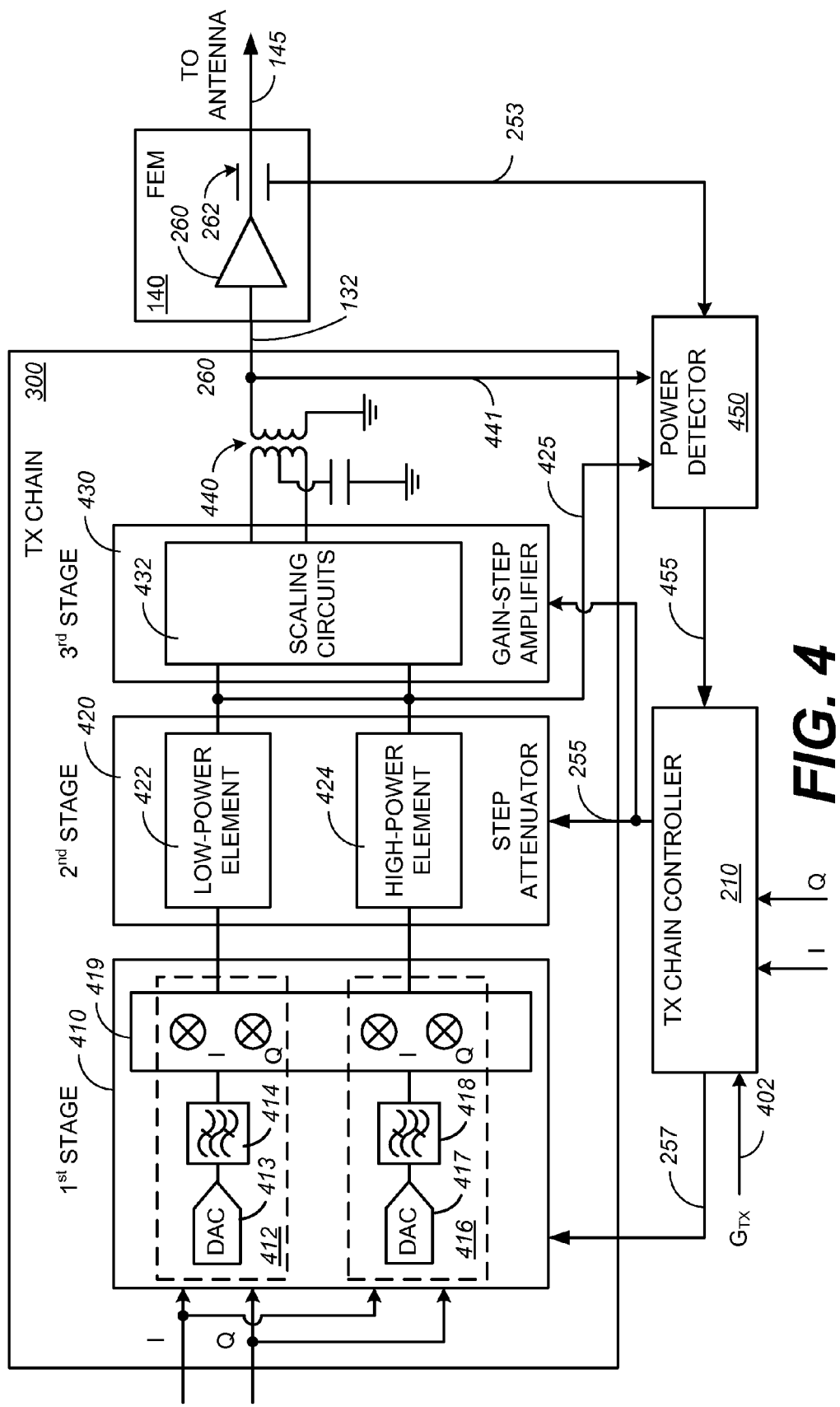
FIG. 4 is a schematic diagram of an embodiment of the transmit chain of FIG. 2.

FIG. 4 is a schematic diagram of an example embodiment of the transmit chain 300 of FIG. 2. As indicated above, the transmit chain 300 can receive the in-phase (I) and quadrature-phase (Q) components of the transmit signal from the baseband subsystem 110 and in accordance with various control inputs received from the transmit chain controller 210, provide an analog and scaled representation of the transmit signal on connection 132. In some embodiments, the transmit chain 300 can accomplish this transformation of the transmit signal via multiple stages.

A first stage 410 can include a low-power path 412 and a high-power path 416. The low-power path 412 can include a series combination of a digital-to-analog converter (DAC) 413, a low-pass filter 414 and a low-power portion of a modulator 419. The high-power path 416 can include a series combination of a digital-to-analog converter (DAC) 417, a low-pass filter 418 and a high-power portion of the modulator 419. The first stage 410 can operate in accordance with one or more control signals provided from the transmit chain controller on connection 257. In some embodiments, the digital-to-analog converter (DAC) 417 in the high-power path 416 of the first stage 410 can provide for up to 3 dB of gain control to the power present in the transmit signal at the input of the transmit chain 300. In some embodiments, the digital-to-analog converter (DAC) 413 in the low-power path 412 of the first stage 410 can provide for up to 6 dB of gain control to the power present in the transmit signal at the input of the transmit chain 300. In some embodiments, each of the low-pass filter 414 and the low-pass filter 418 can provide a switchable 3 dB of gain to the analog signals provided at the output of the digital-to-analog converter (DAC) 413 and at the output of the digital-to-analog converter (DAC) 417, respectively. In some embodiments, controlled selection of one of the low-power portion or the high-power portion of the modulator 419 can provide a switchable 6 dB of gain to the transmit signal. Alternative digital-to-analog converters (DACs) can be used to provide control ranges other than the 3 dB of gain control in the high-power path and the 6 dB of gain control in the low-power path as may be desired.

A second stage of the transmit chain 300 can include a step attenuator 420. The step attenuator 420 can include a low-power element 422 and a high-power element 424. The low-power element 422 can receive the output from the low-power portion of the modulator 419 and forward a gain adjusted signal to a first input of the third stage. The high-power element 424 can receive the output of the high-power portion of the modulator 419 and forward a gain adjusted signal to a respective input of the third stage. In some embodiments, the step attenuator 420 can have a controlled range of about 32 dB. As indicated in FIG. 4, the step attenuator 420 can operate in accordance with one or more control signals forwarded from the transmit chain controller 210 on connection 255. An alternative step attenuator providing a control range of greater than or less than about 32 dB can be used to provide control ranges other than the 32 dB of gain control in the second stage of the transmit chain 300 as may be desired.

A third stage of the transmit chain 300 can include a gain-step amplifier 430 having a set of scaling circuits 432. In some embodiments, the gain-step amplifier 430 can provide controlled gain from about 0 dB to a maximum gain of about 30 dB. The gain-step amplifier can also operate in accordance with one or more control signals forwarded from the transmit chain controller 210 on connection 255. The output of the gain-step amplifier 430 can be applied at the signal input of a power amplifier 260 via the transformer 440, which performs a differential-to-single-ended conversion, to provide a single-ended signal to the power amplifier 260. An alternative gain-step amplifier providing a control range of greater than or less than about 30 dB can be used to provide control ranges other than about 0 dB to 30 dB of gain control in the third stage of the transmit chain 300 as may be desired.

In some implementations, a power detector 450 can be arranged to receive signals indicative of the power at various locations in the transmit chain 300. For example, a first power signal on connection 425 can provide an indication of signal power at the output of the second stage 420. A second power signal on connection 441 can provide an indication of the transmit signal power on connection 132 at the signal input to the power amplifier 260. A third power signal on connection 271 can provide an indication of the signal power at the output of power amplifier 260, which can be forwarded to the antenna 145 (FIG. 1). The power detector 450 can provide one of the first power signal, the second power signal or the third power signal on connection 455 to the transmit chain controller 210 in accordance with a multiplexer input (not shown).

The transmit chain controller 210 can be arranged in a closed control loop with the transmit chain 300. The transmit chain controller 210 can be configured to receive an indication of the transmit signal power on connection 455 from the power detector 450 and an indication of the feedback-path gain control factor ($G_{TX}$) on connection 402. The transmit chain controller 210 can cancel the modulation envelope from the transmit signal and generate coarse and fine control signals for adjusting respective elements in the transmit chain 300 to modify the transmit signal power applied at an input to the power amplifier 260.

In operation, the example transmit signal power control as described herein can be distributed across the multiple stages of the transmit chain 300. The transmit chain 300 and the transmit chain controller 210 can operate in a closed loop for target transmitted power levels from about +3 dBm to maximum transmit power. Below a target transmitted power level of about +3 dBm, the gain step-amplifier 430 and the transmit chain controller 210 may be disabled and the RF transmitter 130 can operate in an open loop mode to its minimum transmitted power level. Starting with the gain-step amplifier 430 operating at or near its maximum output power and with the I and Q (baseband) input signals set at a nominal level, a routine could be enabled to controllably switch the scaling circuits 432 within the gain-step amplifier 430 from the lower gain portions to the higher gain portions. In some implementations, a preferred approach is to adjust the size of the step change as a function of the error identified by the error extractor 240. If the error is relatively large, the size of the step change can be increased by N steps at a time, where N is an integer value. The step size could also be configured as a function of the error identified by the error extractor 240 and a predetermined threshold. The error extractor 240 can allow the transmit signal power level to be controllably incremented at the gain-step amplifier 430 as long as the signal power on connection 425 is larger than the feedback signal power on connection 271. Additional gain changes can be implemented by adjusting the I/Q baseband signal level(s). To further lower or decrease the transmit signal power, the step-attenuator 420 can be controllably adjusted. In some implementations, such a step of the step-attenuator can be about 5 dB per step and about seven steps of control range.

In some situations, it may be desirable to implement about 4 dB in gain reduction in the local oscillator chain or the I/Q mixer switch in the I/Q modulator 419. Such control can provide possible supply current savings for other elements of the transmitter 130 and could reduce (e.g., improve) local oscillator leakage onto the transmit signal. This finer granularity of control typically would not be utilized when a relatively large power step is required such as, for example, a step change of about 10 dB or greater, nor would it need to be used when the transmitter 130 transitions from closed loop power control to an open loop mode.

The following describes operation of the system at a control transition, including how the transmit chain 300 and the transmit chain controller 210 can adjust transmit signal power when control is being managed via a single control element or one particular stage within the transmit chain 300. In some implementations, the entire control system can be used for a relatively short time. In the case of an RF transmitter 130 operating in WCDMA mode, the power control loop would typically be enabled from about 25 µsec prior to the WCDMA slot boundary to about 45 µsec after the WCDMA slot boundary. Afterwards, the I/Q baseband multiplier's value can be fixed as well as the gain step settings. Outside this brief window, elements in the control loop may be reused for other tasks. After the gain control routine is completed, the transmit signal power control loop can be reconfigured to measure the gain of the next transition point. For example, if during the previous gain control routine, power was controlled based on power detection on connection 425, the next routine can continue based on the signal power detected at the input to the power amplifier 260 (e.g., the signal power on connection 441). A self-calibration can be performed to adjust the feedback-path gain control factor $G_{TX}$ to nullify the error at the error extractor 240. The new value of the $G_{TX}$ multiplication factor can then be stored in a memory and the previous value for $G_{TX}$ can be applied back as an initial condition of the transmit signal control loop for the next time slot.

Each time the transmit signal power control system performs a gain control routine it can also calibrate and store a reference level. The operation can remain the same regardless of whether the next step is an increase in transmit signal power or a decrease in transmit signal power. Between time slots, the transmit signal power control system can monitor and store a reference value from the adjacent power monitor branch. In some situations, the absolute reference value (e.g., the value stored between the time slots) is not important as it will be scaled based on the required new gain target.

The same transmit signal power control system could be reused to support the EDGE communication protocol as well as power ramping and power settling to required or desired levels. In some implementations, the algorithm of operation can be somewhat different from that described above. Based on the requirements of the 3G standard for maximum signal power and the limits for spurious emissions, should the transmit signal power raise as a step function at lower power levels, the range of the continuous power control can be greater than 30 dB. Continuous ramping can be performed by adjusting the I/Q baseband signals at the digital-to-analog converters. For the EDGE communication protocol, with the peak to average ratio at about 3.2 dB, the nominal operating point of the digital-to-analog converters can be about 9 dB below full scale. Prior to ramping, the nominal operating point of the I/Q baseband signals can be reduced based on the following formula: $I/Q=32-(P_{MAX}-P_{Target})$, where $P_{MAX}$ is the maximum power for the required range of operation (e.g., 27 dBm for low bands and 26 dBm for high bands) and $P_{Target}$ is the required transmit signal output power after the ramp. The transmit signal power control system can be configured to ramp up via discrete steps in an open loop mode until the antenna power approximates, for example, −4 dBm, and then the control loop can be engaged as the system is taking the last step. At the end of the ramp, the I/Q multiplier can reach its final target in accordance with the loop control and I/Q outputs can start carrying active data. During the ramp, the I/Q output can produce nearly a constant envelope. After the ramp up is complete, the loop can be maintained with minimal capabilities. For example, limits could be placed on the range of the I/Q multiplier or the loop can be placed in a hold condition or an open loop mode. The transmit power control system can resume operation in the opposite sequence to support a transmit power ramp down.

Figure 5:
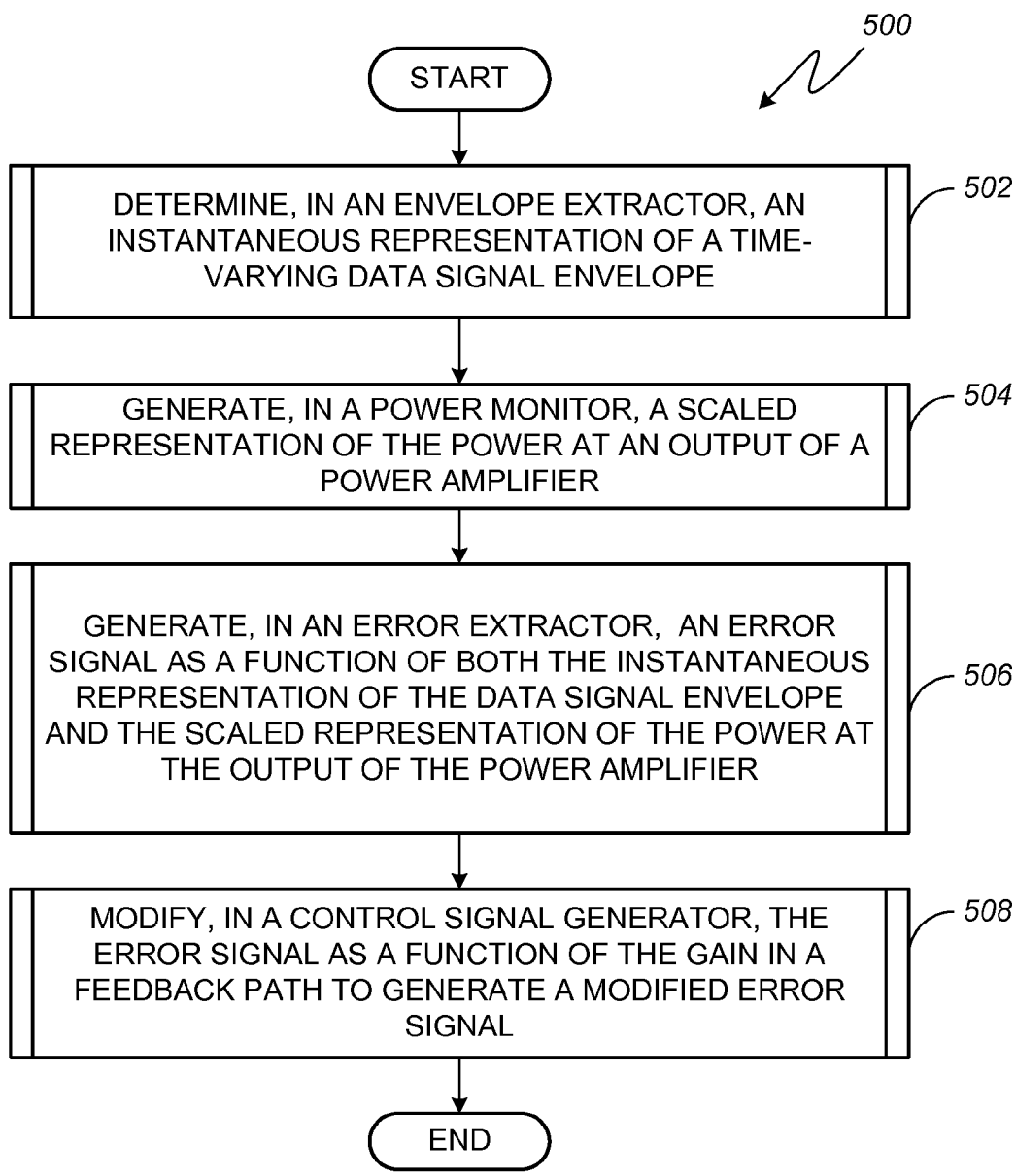
FIG. 5 is a flow diagram illustrating an embodiment of a method for accurately controlling a transmit signal power level in a transmitter.

FIG. 5 is a flow diagram illustrating an embodiment of a method 500 for controlling an adjustable power level. More specifically, the method 500 can cancel the modulation envelope within a closed power control loop. The flow diagram of FIG. 5 shows the example architecture, functionality, and operation of an embodiment of the transmit chain controller 210 in generating control signals that can enable a portion of the dynamic range of the RF transmitter 130. In this regard, each block can represent a circuit or a module in the RF transmitter 130 that implements the specified function(s).

The method 500 can begin with block 502 where an envelope extractor 332 can be used to determine an instantaneous representation of the time-varying data signal envelope. As indicated above, such a representation can be computed by determining the square root of the sum of the squares of the in-phase and quadrature-phase input signals. In block 504, a power monitor 220 can be used to generate a scaled representation of the power at an output of a power amplifier 260. For example, as shown in FIG. 3, a representation of the power at an output of a power amplifier 260 can be generated with a power detector 200, an analog-to-digital converter 320 and a feedback multiplier 326 that applies a factor, $G_{TX}$, corresponding to the gain (or loss) from the output of the power amplifier 260 to the output of the feedback multiplier 326.

In block 506, an error extractor 240 can be used to generate an error signal as a function of both the instantaneous representation of the time-varying data signal envelope produced in block 502 and the scaled representation of the power at the output of the power amplifier generated in block 504. For example, the difference between the respective results from block 502 and block 504 can be used to generate the error signal. In block 508, a control signal generator 240 can be used to modify or adjust the error signal generated in block 506 as a function of the factor, $G_{TX}$, applied in the feedback path. The additional gain ($G_{TX}$) applied in the feedback path can result in a corresponding and undesired change in the loop gain of the control loop. Accordingly, the inverse ($1/G_{TX}$) of the gain ($G_{TX}$) added (and/or lost) in the feedback path, can be applied via a feed-forward multiplier 360 in the control signal generator 250.

Figure 6:
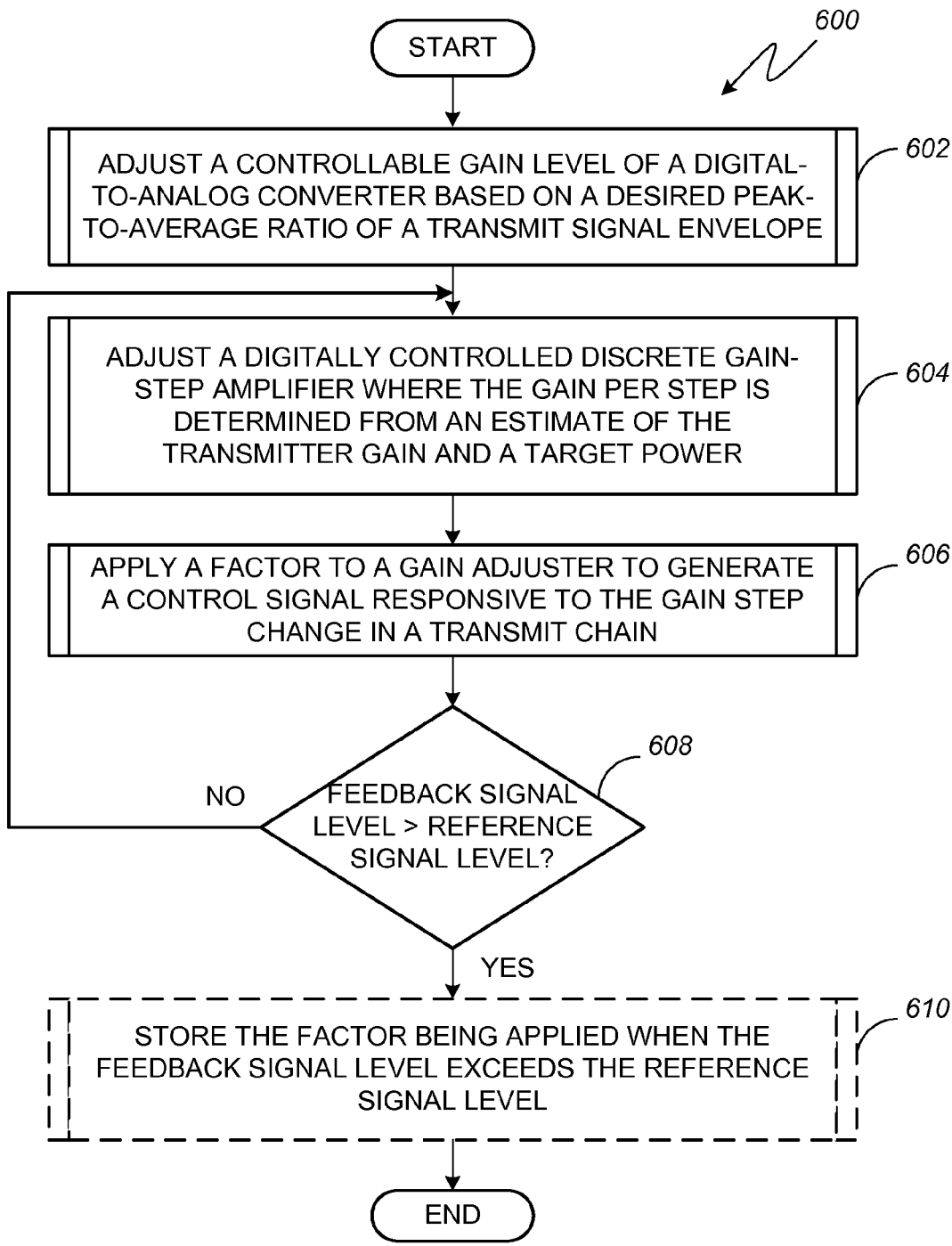
FIG. 6 is a flow diagram illustrating an embodiment of a method for accurately controlling an adjustable power level of a transmit signal in a transmitter.

FIG. 6 is a flow diagram illustrating an embodiment of a method 600 for accurately controlling the power level of a data signal in a transmit chain of a transmitter. More specifically, the method 600 can generate coarse power control signals and fine power control signals that can be applied to respective stages of a multiple stage transmit chain 300. The flow diagram of FIG. 6 shows the example architecture, functionality, and operation of an embodiment of the transmit chain controller 210, which when used in conjunction with the multiple stage transmit chain 300 can controllably adjust the signal power applied to a signal input of a variable gain amplifier to enable a portion of the dynamic range of the RF transmitter 130. In this regard, each block can represent a circuit or a module that implements the specified function(s).

The method 600 can begin with block 602 where a controllable gain level of a digital-to-analog converter 413, 417 can be adjusted based on a desired peak-to-average ratio of the transmit signal envelope. In block 604, a discrete gain-step amplifier 430 can be adjusted. As further indicated in block 604, the gain per step can be determined from an estimate of the transmitter gain and a target transmitter power. In block 606, a factor can be applied to a gain adjuster to generate a control signal responsive to the gain step change in the transmit chain 300. The functions described above in association with blocks 602-606 can be performed in sequences other than that shown in the illustrated embodiment. For example, first a coarse gain adjustment can be applied by manipulating a discrete gain-step amplifier 430 and thereafter, a fine gain adjustment can be made by manipulating the gain of an analog-to-digital converter 413, 417 in the transmit chain 300.

After the transmit chain 300 is adjusted in accordance with the functions described in association with blocks 602-606, a determination can be made in decision block 608 whether the power in the feedback signal is greater than a reference or desired signal power. When the power in the feedback signal exceeds the reference or desired signal power, the method may optionally store the factor being applied when the feedback signal level exceeds the reference signal level as shown in block 610. The stored factor can then be applied as an initial or starting value when the target transmitter power changes. Thereafter, the method 600 can terminate until the target transmitter power changes. Otherwise, when the power in the feedback signal has not exceeded the reference signal power, as indicated by the flow control arrow labeled "NO," the functions performed in blocks 604 and 606 can be repeated.

While various embodiments of the transmitters and methods for controlling an adjustable power level have been described, it will be apparent to those of ordinary skill in the art that many more embodiments and implementations are possible. For example, embodiments of the transmitters and methods for controlling an adjustable transmit signal power level are applicable to different types of radio transmitters and power amplifiers and are applicable to any transmitter that transmits a non-constant envelope signal. In addition, embodiments of the transmitters and methods for controlling an adjustable transmit signal power level are applicable to systems where a nearly continuous output signal power is desired.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation (s), algorithm (s), and/or block(s) of the flowchart(s).

What is claimed is:

1. A transmitter having a transmit signal power control system suitable for operating under multiple communication protocols independent of a modulation data envelope, the transmitter comprising:
    an envelope extractor coupled to an in-phase digital signal input and a quadrature-phase digital signal input, the envelope extractor configured to compute an instantaneous value of an envelope of a combined data signal at an envelope extractor output;
    an error extractor coupled to receive the envelope extractor output and to receive a digital representation of the output power generated by a power amplifier as modified by a feedback multiplier, the error extractor generating an error signal at an extractor output; and
    a feed-forward multiplier coupled to the extractor output and configured to generate a modified error signal at a feed-forward multiplier output.

2. The transmitter of claim 1 further comprising a unit converter coupled to the feed-forward multiplier output and configured to generate a digital control signal coupled to a control input of a variable gain amplifier.

3. The transmitter of claim 2 wherein the unit converter performs a linear-to-logarithmic conversion of the modified reference signal.

4. The transmitter of claim 1 wherein the envelope extractor receives the in-phase digital signal input and the quadrature-phase digital signal input from a baseband subsystem and calculates a square root of the sum of the square of the magnitude of the in-phase digital signal and the square of the quadrature-phase digital signal.

5. The transmitter of claim 1 wherein the digital representation of the output power generated by the power amplifier is responsive to a diode detector.

6. The transmitter of claim 1 wherein the digital representation of the output power generated by the power amplifier is responsive to a log detector.

7. The transmitter of claim 1 further comprising a unit converter coupled between the envelope extractor and the error extractor.

8. The transmitter of claim 7 wherein the unit converter performs a linear-to-logarithmic conversion of the instantaneous value of the envelope of the combined data signal.

9. The transmitter of claim 1 wherein the feedback multiplier is responsive to a control input that varies as a function of gain in a feedback path.

10. The transmitter of claim 9 wherein the feed forward multiplier is responsive to a control input that varies as a function of the inverse of the gain in the feedback path.

11. The transmitter of claim 1 further comprising:
    a transmit chain having a first stage, a second stage, and a third stage, the transmit chain receiving a baseband in phase data signal and a baseband quadrature phase data signal and generating a transmit signal for application at an input of a power amplifier; and
    a transmit chain controller arranged in a closed control loop with the transmit chain.

12. The transmitter of claim 11 wherein the first stage includes a first path and a second path, the first path and the second path each including respective digital-to-analog converters, low-pass filters, and modulators, one of the first path and the second path configured to provide a first range of gain control and the other path configured to provide a second range of gain control different from the first range of gain control.

13. The transmitter of claim 12 wherein the modulators provide approximately 6 dB of gain control.

14. The transmitter of claim 11 wherein the second stage includes a digitally-controlled step attenuator that provides approximately 32 dB of gain control.

15. The transmitter of claim 11 wherein the third stage includes a digitally-controlled discrete gain-step amplifier that provides approximately 32 dB of gain control.

16. The transmitter of claim 11 wherein the transmit chain controller receives indicators of the transmit signal power from respective locations in the transmit chain.

17. The transmitter of claim 16 wherein the transmit chain controller includes an error estimator coupled to a logic element and a gain adjuster, the logic element generating a plurality of first gain control signals selectively distributed across the second stage and the third stage, the gain adjuster applying a factor responsive to the gain step change in the transmit chain to generate a second gain control signal suitable for adjusting the digital-to-analog converters in the first stage.

18. A method for accurately controlling an adjustable power level in a transmitter that is transmitting a data signal with a time-varying signal envelope, the method, comprising:

determining, in an envelope extractor, an instantaneous representation of the data signal envelope;
monitoring a power at the output of a power amplifier using a log power detector;
generating a scaled representation of the power at the output of the power amplifier;
generating an error signal as a function of both the instantaneous representation of the data signal envelope and the scaled representation of the power at the output of the power amplifier;
modifying the error signal as a function of the gain in a feedback path to generate a modified error signal;
modifying the scaled representation of the power at the output of the power amplifier with a multiplier to generate a gain adjusted representation of the output of the power amplifier; and
using a unit converter to adjust the instantaneous representation of the data signal envelope.

19. A method for accurately controlling an adjustable power level in a transmitter that is transmitting a data signal with a time-varying signal envelope, the method, comprising:
determining, in an envelope extractor, an instantaneous representation of the data signal envelope;
monitoring a power at the output of a power amplifier using a linear power detector;
generating a scaled representation of the power at the output of the power amplifier;
generating an error signal as a function of both the instantaneous representation of the data signal envelope and the scaled representation of the power at the output of the power amplifier;
modifying the error signal as a function of the gain in a feedback path to generate a modified error signal;
modifying the representation of the output of the power amplifier with a multiplier; and
using a unit converter to adjust the modified error signal to generate a power control signal.

20. A signal power control system comprising:
a reference generator implemented to receive and combine an in-phase digital signal and a quadrature-phase digital signal so as to yield a combined signal, the reference generator further implemented to generate an output signal representative of an instantaneous value of an envelope of the combined signal;
an error extractor implemented to receive a first input signal including the output signal of the reference generator and a second input signal including a digital representation of an output of a power amplifier, the error extractor further implemented to generate an error signal based on the first and second input signals; and
a control signal generator implemented to receive the error signal and generate one or more control signals for controlling a gain of an analog section of a transmit chain that provides a modulated analog signal to the power amplifier.

21. The system of claim 20 wherein the power control system includes a transmit signal power control system.

22. The system of claim 21 wherein the reference generator includes an envelope extractor configured to receive and combine the in-phase and quadrature-phase digital signals and generate the instantaneous value of the envelope of the combined signal.

23. The system of claim 21 wherein the control signal generator includes an error estimator and a logic element configured to quantify the magnitude of the error signal and generate a coarse power control signal and an adjustment signal.

24. The system of claim 23 wherein the control signal generator further includes a multiplier configured to receive as inputs the error signal and a sum of the adjustment signal from the logic element and an inverse of a feedback-path gain factor, the control signal generator further configured to generate a fine power control signal that reduces undesired changes in loop gain of a power control loop.

25. The system of claim 24 wherein the fine power control signal includes a product of the inputs.

26. The system of claim 25 wherein the control signal generator further includes a digital adder configured to receive and add the adjustment signal from the logic element and the inverse of a feedback-path gain factor, the digital adder further configured to provide the sum to the multiplier.

27. The system of claim 25 wherein the control signal generator further includes a low-pass filter configured to remove or filter the fine power control signal.

28. The system of claim 21 wherein the transmit signal power control system is configured to operate under a plurality of communication modes.

29. The system of claim 28 wherein the communication modes include WCDMA/LTE communication modes.

30. The system of claim 28 wherein the communication modes include EDGE/GMSK communication modes.

31. The system of claim 30 wherein the reference generator includes a unit converter configured to receive the instantaneous value of the envelope and generate a converted value representative of the instantaneous value, the unit converter further configured to forward to the converted value to the error extractor.

32. The system of claim 31 wherein the unit converter includes a log converter configured to perform a linear-to-logarithmic conversion.

33. The system of claim 30 wherein the control signal generator includes a unit converter configured to receive at least one of the one or more control signals and generate a converted value.

34. The system of claim 33 wherein the at least one control signal includes a fine power control signal.

35. The system of claim 34 wherein the unit converter includes a log converter configured to perform a linear-to-logarithmic conversion.

36. A transmitter module for a wireless device, the module comprising:
a packaging substrate;
a semiconductor die mounted on the packaging substrate, the semiconductor die having an integrated circuit configured to provide power control for transmitted signal, the integrated circuit including a reference generator implemented to receive and combine an in-phase digital signal and a quadrature-phase digital signal so as to yield a combined signal, the reference generator further implemented to generate an output signal representative of an instantaneous value of an envelope of the combined signal; an error extractor implemented to receive a first input signal including the output signal of the reference generator and a second input signal including a digital representation of an output of a power amplifier, the error extractor further implemented to generate an error signal based on the first and second input signals; and a control signal generator implemented to receive the error signal and generate one or more control signals for controlling a gain of an analog section of a transmit chain that provides a modulated analog signal to the power amplifier; and
a packaging structure configured to provide protection for the mounted semiconductor die.

37. The module of claim 36 wherein the transmitter module is a part of a transceiver module.

38. A wireless device comprising:
an antenna configured to facilitate receiving and sending of radio-frequency (RF) signals;
a receiver circuit configured to process an RF signal received from the antenna;
a transmitter circuit configured to process an RF signal to be provided to the antenna, the transmitter circuit including an integrated circuit configured to provide power control for transmitted signal, the integrated circuit including a reference generator implemented to receive and combine an in-phase digital signal and a quadrature-phase digital signal so as to yield a combined signal, the reference generator further implemented to generate an output signal representative of an instantaneous value of an envelope of the combined signal; an error extractor implemented to receive a first input signal including the output signal of the reference generator and a second input signal including a digital representation of an output of a power amplifier, the error extractor further implemented to generate an error signal based on the first and second input signals; and a control signal generator implemented to receive the error signal and generate one or more control signals for controlling a gain of an analog section of a transmit chain that provides a modulated analog signal to the power amplifier; and
a baseband subsystem configured to provide control signals for operation of the receiver and transmitter circuits.

39. The wireless device of claim 38 wherein the baseband subsystem is configured to generate the in-phase digital signal and the quadrature-phase digital signal.

40. The wireless device of claim 39 wherein the reference generator includes an envelope extractor configured to receive the in-phase digital signal and the quadrature-phase digital signal and to calculate a square root of the sum of the squares of the in-phase digital signal and the quadrature-phase digital signal.

41. The wireless device of claim 38 further comprising a power monitor configured to receive an analog signal and to generate the digital representation of the output of the power amplifier.

42. The wireless device of claim 41 further comprising a log power detector configured to generate the analog signal.

43. The wireless device of claim 41 further comprising a linear power detector configured to generate the analog signal.

44. The wireless device of claim 41 wherein the power monitor includes an analog-to-digital converter configured to receive the analog signal and to generate a digital signal, and a filter configured to receive the digital signal and to generate a filtered signal.

45. The wireless device of claim 44 wherein the power detector further includes a digital multiplier configured to generate the digital representation of the output of the power amplifier by multiplying the filtered signal by a gain control factor.

46. The wireless device of claim 38 wherein the wireless device is configured to operate under a plurality of communication modes.

47. The wireless device of claim 38 wherein the communication modes include WCDMA/LTE modes and EDGE/GMSK modes.

48. A transmit signal power control system for a wireless device, the system comprising:
a transmit signal path having a transmit chain and one or more power amplifiers, the transmit chain configured to receive a digital in-phase signal and a digital quadrature-phase signal and generate a modulated analog signal as an input for the one or more power amplifiers, the transmit chain including an analog section configured to provide variable gain for the modulated analog signal; and
a control loop configured to generate one or more control signals for adjusting the variable gain of the analog section of the transmit chain based on a digital representation of an output of the one or more power amplifiers, the digital in-phase signal, and the digital quadrature-phase signal, the control loop including a reference generator configured to combine the in-phase digital signal the quadrature-phase digital signal to yield a combined signal, the reference generator further configured to generate an output signal representative of an instantaneous value of an envelope of the combined signal, the control loop further including an error extractor configured to generate an error signal based on the output signal of the reference generator and on the digital representation of the output of the one or more power amplifiers, the control loop further including a control signal generator configured to receive the error signal and to generate one or more control signals for controlling the variable gain of the analog section of the transmit signal path.

49. A method for controlling power of a radio-frequency (RF) signal in a wireless device, the method comprising:
generating a modulated analog signal based on a digital in-phase signal and a digital quadrature-phase signal;
amplifying the modulated analog signal using one or more power amplifiers so as to yield an output signal;
combining the digital in-phase signal and the digital quadrature-phase signal to generate a combined signal;
generating a reference signal representative of an instantaneous value of an envelope of the combined signal using a reference generator;
generating an error signal based on the reference signal and on a digital representation of the output signal of the one or more power amplifiers;
generating, by a control loop, a control signal for adjusting a gain associated with the modulated analog signal based on the error signal; and
adjusting the gain associated with the modulated analog signal using the control signal.

50. The method of claim 49 wherein the adjusted modulated analog signal is responsive to a gain change.

* * * * *